United States Patent
Chen et al.

(10) Patent No.: US 8,456,916 B2
(45) Date of Patent: Jun. 4, 2013

(54) NON-VOLATILE MEMORY UNIT CELL WITH IMPROVED SENSING MARGIN AND RELIABILITY

(75) Inventors: Hsin-Ming Chen, Tainan County (TW); Shih-Chen Wang, Taipei (TW); Wen-Hao Ching, Hsinchu County (TW); Yen-Hsin Lai, Taipei (TW); Hau-Yan Lu, Kaohsiung (TW); Ching-Sung Yang, Hsinchu (TW)

(73) Assignee: eMemory Technology Inc., Hsinchu (TW)

( * ) Notice: Subject to any disclaimer, the term of this patent is extended or adjusted under 35 U.S.C. 154(b) by 0 days.

(21) Appl. No.: 13/541,755

(22) Filed: Jul. 4, 2012

(65) Prior Publication Data

US 2012/0273860 A1    Nov. 1, 2012

Related U.S. Application Data

(62) Division of application No. 12/750,650, filed on Mar. 30, 2010, now Pat. No. 8,363,475.

(51) Int. Cl.
*G11C 11/34* (2006.01)

(52) U.S. Cl.
USPC .................................................. 365/185.18

(58) Field of Classification Search
USPC ........................... 365/185.18, 185.05, 185.09
See application file for complete search history.

(56) References Cited

U.S. PATENT DOCUMENTS

2008/0138950 A1* 6/2008 Fang et al. ..................... 438/257
2008/0151623 A1* 6/2008 Fang et al. ............... 365/185.05

* cited by examiner

*Primary Examiner* — Hoai V Ho
*Assistant Examiner* — Tri Hoang
(74) *Attorney, Agent, or Firm* — Jianq Chyun IP Office

(57) ABSTRACT

An only-one-polysilicon layer non-volatile memory unit cell includes a first P-type transistor, a second P-type transistor, a N-type transistor pair, a first and second coupling capacitors is provided. The N-type transistor pair has a third transistor and a fourth transistor that are connected. The third transistor and the fourth transistor have a first floating polysilicon gate and a second floating polysilicon gate to serve as charge storage mediums, respectively. One end of the second coupling capacitor is connected to the gate of the second transistor and is coupled to the second floating polysilicon gate, the other end of the second coupling capacitor receives a second control voltage. One end of the second coupling capacitor is connected to the gate of the second transistor and is coupled to the second floating polysilicon gate, the other end of the second coupling capacitor receives a second control voltage.

5 Claims, 9 Drawing Sheets

NON-VOLATILE MEMORY UNIT CELL WITH IMPROVED SENSING MARGIN AND RELIABILITY

CROSS-REFERENCE TO RELATED APPLICATION

This application is a divisional application of U.S. application Ser. No. 12/750,650, filed on Mar. 30, 2010, now pending. The entirety of the above-mentioned patent application is hereby incorporated by reference herein and made a part of this specification.

BACKGROUND OF THE INVENTION

1. Field of the Invention

The present invention relates to an only-one-polysilicon layer non-volatile memory cell, especially for the methods to improve sensing margin and reliability.

2. Description of Related Art

A non-volatile memory is a memory capable of holding stored data when the memory is not supplied with power. There are currently two types of non-volatile memories, i.e. read only memory (ROM) and flash memory.

FIG. 1 illustrates a conventional stacked polysilicon layers non-volatile memory unit cell and sensing of data thereof which was disclosed in U.S. Pat. No. 5,973,957. Referring to FIG. 1, floating polysilicon gates of transistors 101 and 102 which used to store data receive the same voltage VG and generate currents I1 and I2, respectively. A comparator CMP compares voltages generated by the currents I1 and I2 flowing through transistors 103 and 104 to detect data stored in the non-volatile memory unit cell (transistors 101 and 102), wherein each of the transistors 103 and 104 forms a diode by appropriately coupling terminals thereof and is connected to an operating voltage VCC. The major idea for this sensing scheme is to use a memory unit cell as a source of reference current. The sensing margin is greatly improved by adopting a dummy reference memory unit cell receiving similar bias variations, temperature sensitivity, and cell dimension matching with the memory cell.

FIG. 2A illustrates another prior art for a non-volatile memory unit cell and sensing of data thereof which was disclosed in U.S. Pat. No. 6,950,342. Referring to FIG. 2A, the non-volatile memory unit cell 210 includes coupling capacitors constructed by transistors M1c, M1t, M0t and M0c, and transistors M1 and M0 connected to a voltage V. The transistors M1c and M1t couple received voltages V1c and V1t to the floating polysilicon gate Fg1, respectively. The transistors M0c and M0t couple received voltages V0c and V0t to the floating polysilicon gate Fg0, respectively. A current sensor 220 senses the data stored in the non-volatile memory unit cell 210 by measuring the currents I1 and I0 flowing out of the transistors M1 and M0. A sensing margin is also improved by comparing a memory unit cell and a dummy reference memory cell.

It is noted that electric leakage may occur due to defect of the gate oxide of the transistor M1 or M0 after the non-volatile memory unit cell 210 stores data for cycling induced oxide stress or a long storage time. If this electric leakage occurs, the charges originally stored at the transistor M1 or M0 would decrease and on-state current would also decrease over storage time as shown in FIG. 2B. As such, the memory window A1 between a current curve CV1 when the transistor M1 or M0 turns on and a current curve CV2 when the transistors M1 or M0 turns off would decrease to the memory window A2 with increasing of the storage time. Accordingly, the sensing result of the current sensor 220 may be incorrect which would result in misjudgement of the data stored in the non-volatile memory unit cell 210.

To read a memory cell's data correctly, a memory window is a critical design parameters for a non-volatile memory chip. There are some factors which will affect the memory window such as a mismatching between a memory unit cell and a reference device (device dimension, temperature, operation bias, for examples), a critical leakage path surrounding the floating polysilicon gate of the memory unit cell (floating polysilicon gate oxide, sidewall spacer, for examples). In this background, several improved techniques are disclosed and targeting to solve these issues, improving the memory window of non-volatile memory chip.

SUMMARY OF THE INVENTION

Accordingly, the present invention is directed to non-volatile memory cells which each non-volatile memory unit cell comprises two identical memory elements with pre-determined connections and arrangements to serve as a purpose to improve sensing margin. In such way, these three type memory transistors can effectively widen the memory window or compensate for the un-expected electric leakage during data storage period.

The present invention provides still another only-one-polysilicon layer non-volatile memory unit cell including first and second P-type transistors, a N-type transistor pair, and first and second coupling capacitors. The first P-type transistor has a gate and a first source/drain. The second P-type transistor has a gate and a first source/drain. The N-type transistor pair has a third transistor and a fourth transistor that are connected in series. The third transistor and the fourth transistor have a first floating polysilicon gate and a second floating polysilicon gate, respectively. One end of the first coupling capacitor is connected to the gate of the first transistor and coupled to the first floating polysilicon gate. The other end of the first coupling capacitor receives a first control voltage. One end of the second coupling capacitor is connected to the gate of the second transistor and coupled to the second floating polysilicon gate. The other end of the second coupling capacitor receives a second control voltage.

In summary, the present invention provides an only-one-polysilicon layer non-volatile memory unit cell in which injection or removal of electrons or holes can be achieved to write or delete data in the manner of F-N tunneling, band-to-band tunneling hot electron (BBHE), band-to-band tunneling hot hole (BBHH), substrate hole, or channel hot electron (CHE). The non-volatile memory unit cell of the present invention comprises two identical memory elements with pre-determined connections and arrangements to serve as a purpose to improve sensing margin. In such way, the non-volatile memory unit cell can effectively widen the memory window or compensate for the un-expected electric leakage during data storage.

In order to make the aforementioned and other features and advantages of the present invention more comprehensible, embodiments accompanied with figures are described in detail below.

DESCRIPTION OF THE EMBODIMENTS

Figure 1:
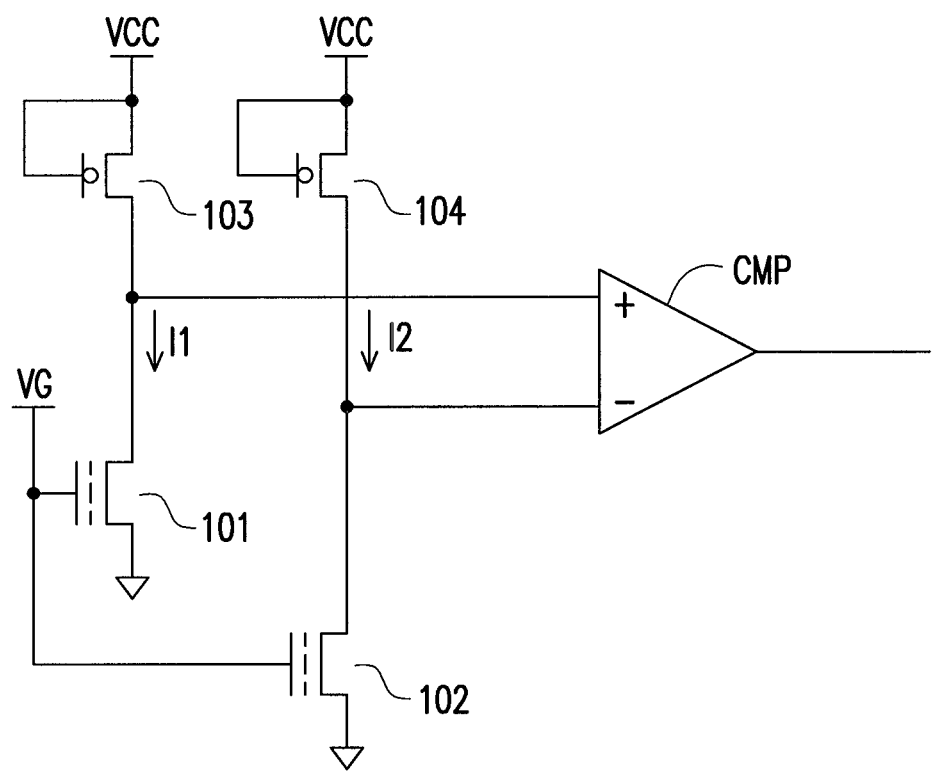
FIG. 1 illustrates a conventional stacked polysilicon layers non-volatile memory unit cell and sensing of data thereof.
Figure 2A:
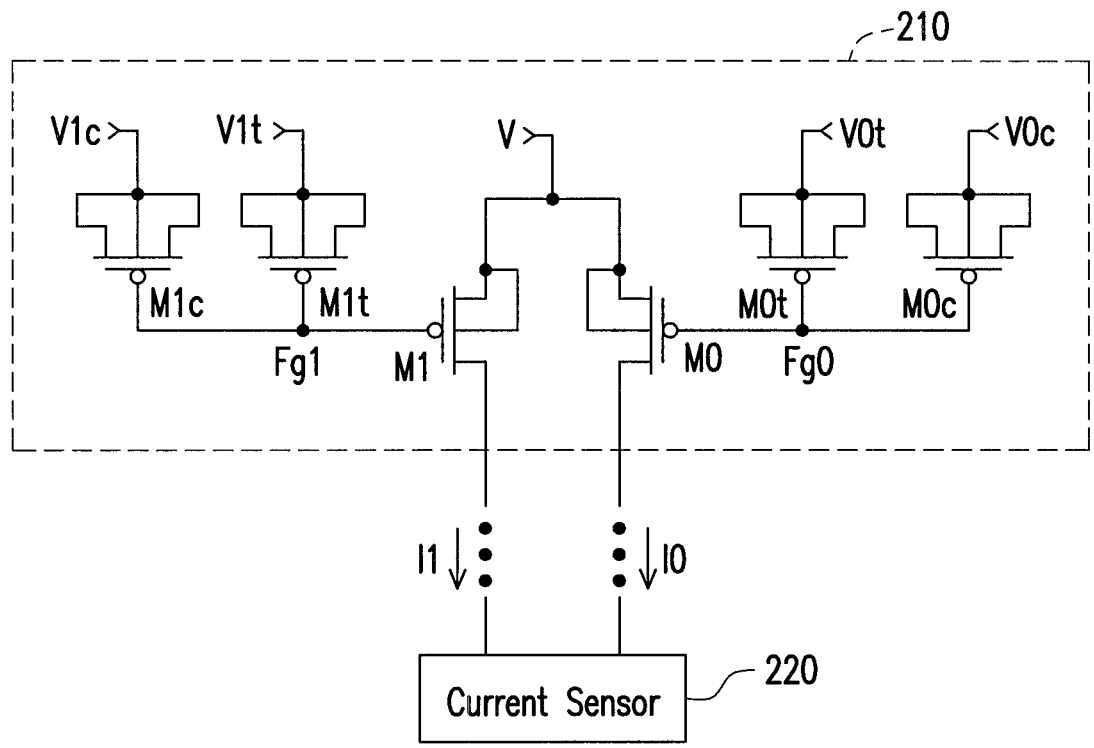
FIG. 2A illustrates another conventional non-volatile memory unit cell and sensing of data thereof.
Figure 2B:
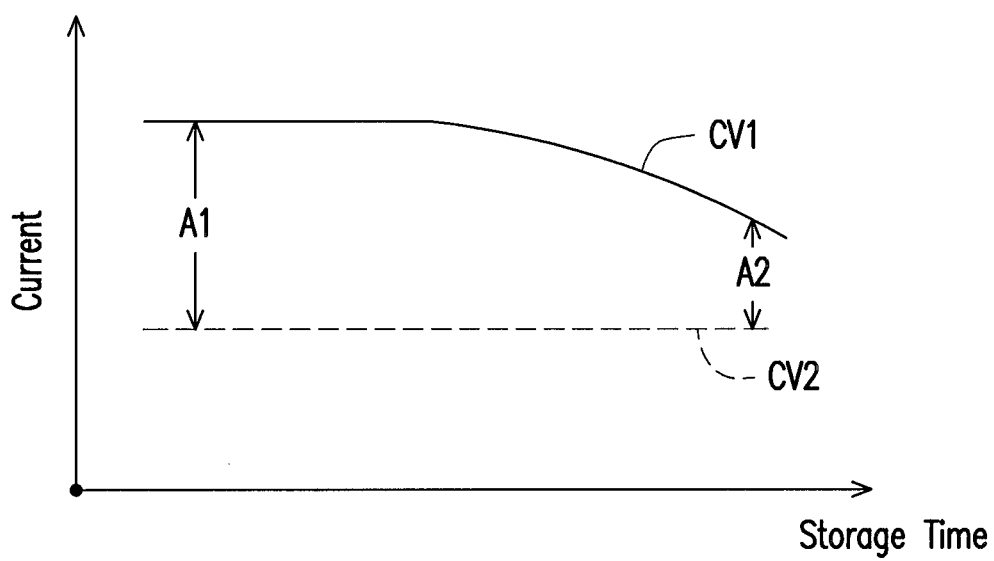
FIG. 2B is a current curve diagram showing the relationship between the currents when the transistor turns on and off with the storage time.
Figure 3A:
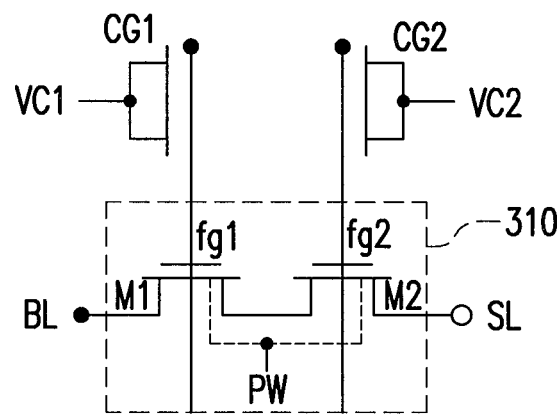
FIG. 3A-3C illustrates an only-one-polysilicon layer non-volatile memory unit cell according to one embodiment of the present invention.

FIG. 3A illustrates an only-one-polysilicon layer non-volatile memory unit cell 300 according to one embodiment of the present invention. In some non-volatile memory technologies, two or more polysilicon layers are processed and stacked to achieve non-volatility purpose. In this embodiment, an only one polysilicon layer is discussed and addressed for a more cost-effective non-volatile memory solution and more suitable for embedded memory applications. Referring to FIG. 3A, the non-volatile memory unit cell 300 includes a transistor pair 310 and control gates CG1 and CG2. The transistor pair 310 includes a transistor M1 and a transistor M2 connected in series. The transistor M1 and the transistor M2 have a floating polysilicon gate fg1 and a floating polysilicon gate fg2, respectively, and the floating polysilicon gate fg1 and the floating polysilicon gate fg2 are electrically or physically isolated. The control gate CG1 is coupled to the floating polysilicon gates fg1 through a capacitively coupling junction. Similarly, the control gate CG2 is coupled to the floating polysilicon gates fg2 through another capactively coupling junction.

The control gates CG1 and CG2 receive control voltages VC1 and VC2, respectively, and capacitively couple the control voltage VC1 and VC2 to the floating polysilicon gate fg1 and floating polysilicon gate fg2 through corresponding coupling junctions. The control gates CG1 and CG2 can be constructed by capacitors, for example, P+/NW or N+/NW junction. In addition, this capacitor can be implemented by the capacitor formed by a transistor (e.g. the body, drain and source of the transistor are tied together to form one terminal of a capacitor and the gate of the transistor serves as another terminal of the capacitor). In this embodiment, P-type metal-oxide-semiconductor field-effect transistors (MOSFET) is preferred to use as a coupling capacitor due to the n-well body can have positive voltage isolated from p-well and p-substrate.

Figure 3B:
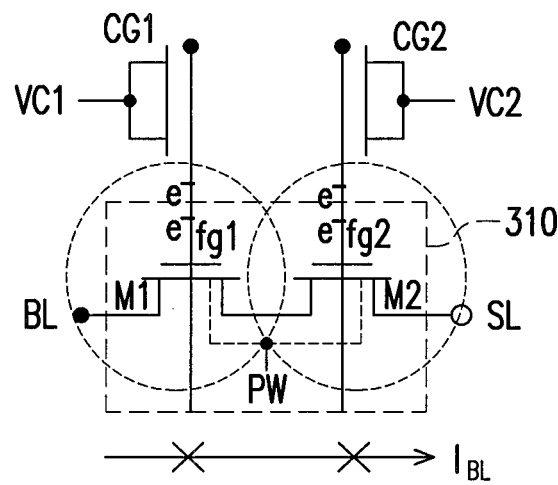

It is noted that, in the present embodiment, the transistors M1 and M2 of the transistor pair 310 are both N-type MOSFET, receiving same electrical writing or data deleting operations. That is, the same programming and erase operations are applied to these two transistors M1 and M2. Moreover, if there are electrons stored in floating polysilicon gate fg1 and floating polysilicon gate fg2, the memory unit cell 300 will feature higher threshold voltage and less current flow $I_{BL}$ from BL to SL terminal when compared to the condition without electrons stored in both floating polysilicon gates fg1 and fg2 as described in FIG. 3B. It means that the electrons stored in floating polysilicon gates fg1 and fg2 will together reduce the current conduction $I_{BL}$ from BL to SL terminal at transistor M1 and M2.

Figure 3C:
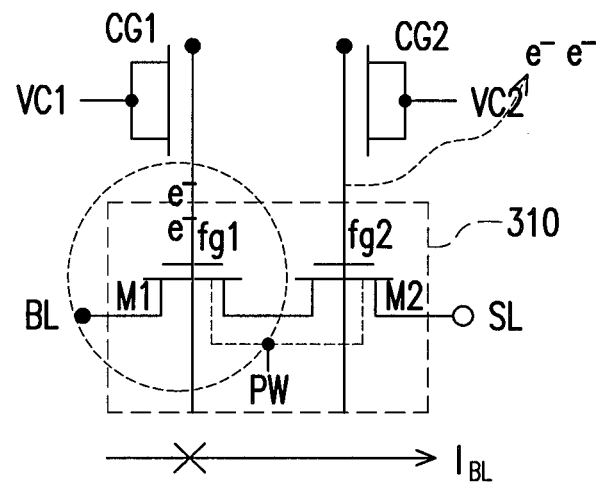

For memory unit cell design, the charge retention problem is needed to be taken into considerations, especially for those memory technologies with worse charge leakage issue. In real world, as shown in FIG. 3C, electrons originally stored in floating polysilicon gate fg2 will leak away and no electrons remain at floating polysilicon gate fg2 of M2 transistor any more. In this case, the channel underneath the floating polysilicon gate fg2 of M2 transistor will turn on except an additional turn-off switch exists to shut down the M2 transistor. To overcome the charge loss issue in floating polysilicon gate fg2 of M2 transistor, M1 transistor is designed to connect in series with M2 transistor (especially in read path direction) to have the shut-down path from BL to SL, thanks for the electrical or physical isolation between the floating polysilicon gate fg1 and fg2. In more detail failure rate analysis, n-bit floating polysilicon gate memory transistors form the memory array IP and each floating polysilicon gate transistor has failure rate "f". And, the total failure rate F1 in the memory array IP:

$F1=1-(1-f)^n$; where $F1$ is the failure rate without additional $M1$ connected in series for each bit To improve the reliability of this memory array IP, M1 is added in series with M2 transistor for each bit configuration. In this new configuration, The total failure rate F2 in the new memory array IP:

$F2=1-(1-f^2)^n$; where $F2$ is the failure rate with additional $M1$ connected in series for each bit The reliability of memory array IP will be greatly improved when compared F2 failure rate with F1 failure rate. That is, the first transistor M1 and second transistor M2 serve as a fault tolerance cell and do self-repair automatically if stored charges in one of the transistors move away from the storage medium.

Figure 3D:
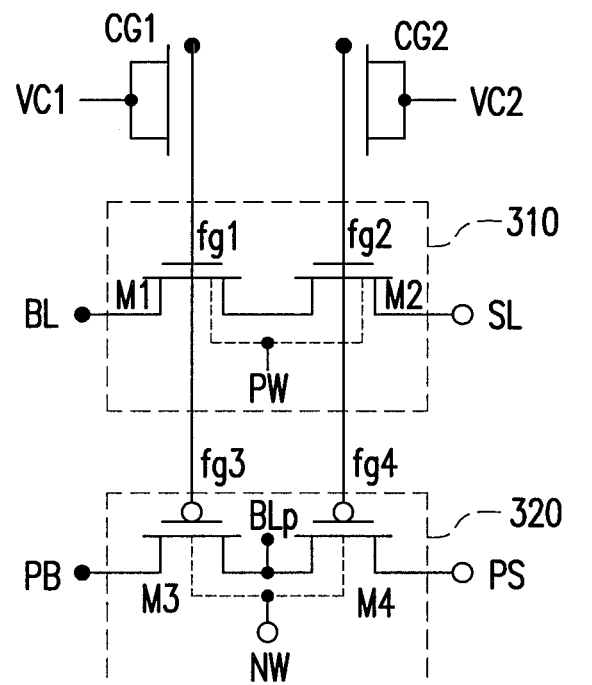
FIG. 3D illustrates an only-one-polysilicon layer non-volatile memory unit cell according to another embodiment of the present invention.

FIG. 3D shows another embodiment of memory unit cell 300, the transistors M3 and M4 of the transistor pair 320 are added and are of a type opposite to the type of the transistors M1 and M2. Namely, in the present embodiment, the transistors M3 and M4 are both P-type MOSFETs and connected in parallel and the transistors M3 and M4 connected to signal BLp. It is to be understood from the foregoing description that the transistors M1 and M2 may be formed in a P-well (PW) of an integrated circuit while the transistors M3 and M4 may be formed in an N-well (NW) of an integrated circuit. The transistors M3 and M4 are used for a tunneling purpose. Usually, the transistors M3 and M4 are often the smallest device dimension when compared with the devices CG1/CG2 and M1/M2. And, the transistors M3 and M4 also can be configured as a tunneling junction form in order that electrons can tunnel from or into the floating gates (polysilicon layers) through these tunnelling junctions. A tunneling junction is regarded as a region which electrons or charges are tunneling in or from, while a coupling junction is used as an electrically capacitively coupling purpose.

It is also noted that, in the present embodiment, to fulfil low voltage read operation, the transistors M1 and M2 may be native transistors with a very low threshold voltage or receiving additional lightly doped drain (LDD) implantation when forming core device processing. As such, the voltage necessary for reading operations with respect to the non-volatile memory unit cell 300 can be effectively reduced. Moreover, in order to guarantee the high quality of non-volatile memory cells, a salicide protection layer (SAP) is specially designed to add on top of floating polysilicon gate. It eliminates not only the mechanical stress from ILD layer (Inter Layer Dielectric) in subsequent process but also the suicide shorting from floating polysilicon gate to silicided S/D (source or drain) junctions along the sidewall spacer. In this configuration, the charge retentivity is greatly enhanced.

Writing, deleting and reading operations with respect to the non-volatile memory unit cell 300 are described below with reference to FIG. 3D so that persons skilled in the art can understand application of the non-volatile memory unit cell 300.

To perform a writing operation for the non-volatile memory unit cell 300, the control gates CG1 and CG2 receive high level control voltages VC1 and VC2, and the control voltages VC1 and VC2 are capacitively coupled to the floating polysilicon gates fg1 and fg2 through the coupling junctions, respectively. As such, a plurality of electrons is attracted to and stored on the floating polysilicon gates fg1 and fg2. At the same time, because the control gates CG1 and CG2 also couple the control gates VC1 and VC2 to the floating polysilicon gates fg3 and fg4, the transistors M3 and M4 also attract a plurality of electrons when the transistor pair 320 is provided, wherein the floating polysilicon gate fg3 and the floating polysilicon gate fg4 are electrically or physically isolated. It is noted that, in the present embodiment, because the transistors M1 and M2 are N-type MOSFETs, the electrons attracted to the floating polysilicon gates fg1 and fg2 cause the channels of the transistors M1 and M2 to be more turn-off. On the contrary, the transistors M3 and M4 are P-type MOSFETs and therefore the electrons attracted to the floating polysilicon gates fg3 and fg4 cause the channels of the transistors M3 and M4 to be more turn-on.

In this arrangement, the N-type MOSFETs M1 and M2 are designed in serially connected. It means one S/D junction of M1 connects another S/D junction of M2 without any coupling terminal coupled (or it can be said the connected S/D junction is floating node). On the contrary, the P-type MOSFET M3 and M4 are designed in parallel connection. There exist PB and PS terminals coupled to one S/D junctions of M3 and M4 transistors, respectively. Additional BLp terminal is connected to the other S/D junctions of M3 and M4 transistors and this other S/D junctions of M3 and M4 transistors are not floating anymore.

A reading operation for the non-volatile memory unit cell 300 can be performed by providing voltages to the source/drain terminals BL, PB, PS and BLp with the remaining terminals biased and generating a corresponding current at the source/drain SL, PB/PS of the transistors M2 and M3/M4. Upon data stored in the non-volatile memory unit cell 300 being detected, the current generated at the source/drain SL, PB/PS of the transistors M2 and M3/M4 may be received and compared against a threshold value (Iref) to determine the data (Logic high level or low level) stored in non-volatile memory unit cell 300. In case that the transistor pair 320 is provided, the data stored in the non-volatile memory unit cell 300 can also be determined by receiving and comparing the current generated at the source/drain SL, of the transistor M2 against a threshold value (Iref) for the N-channel transistor reading. For P-channel transistor reading, the currents from PB and PS of M3/M4 transistors are added and comparing against a threshold value (Iref). Moreover, the non-volatile memory unit cell 300 can also serve as a self-referencing memory cell by comparing the current generated at the source/drain SL of M2 transistor against the sum of currents from the source/drain PB/PS of M3/M4 transistors.

It is noted that, if defect of the gate oxide of one (e.g. the transistor M2) of the transistors M1 and M2 occurs due to intrinsic oxide defect, cycling induced oxide stress or overlong time storage, the number of the electrons originally attracted to the floating polysilicon gate fg2 of the transistor M2 reduces because of electric leakage. That is to say, the channel of the transistor M2 may not maintain at the turn-off state. However, this will not cause any misjudgement during the reading operation for the non-volatile memory unit cell 300. The reason is that the channel of the transistor M1 remains at the turn-off state although the channel of the transistor M2 may not maintain at the turn-off state. Therefore, the current generated at the source/drain SL of the transistor M2 does not change although the possible leakage path is formed within the gate oxide of the transistor M2. Also because of this, no mistakes would be made in determining the data of the non-volatile memory unit cell 300. By the way, the charges movement are identically the same in all floating polysilicon gates of the transistor M1 and the second transistor M2 when the non-volatile memory unit cell 300 are at write or data deleting mode.

Figure 4:
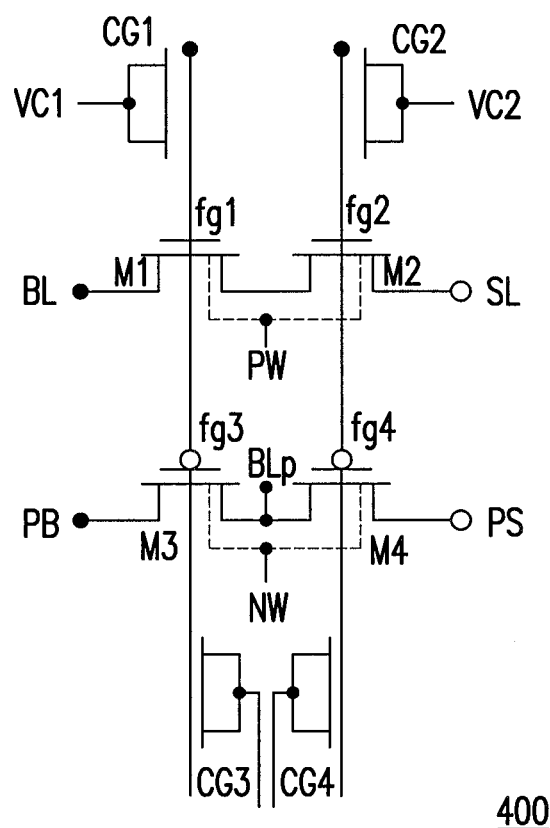
FIG. 4 illustrates an only-one-polysilicon layer non-volatile memory unit cell according to another embodiment of the present invention.

FIG. 4 illustrates a non-volatile memory unit cell 400 according to another embodiment of the present invention. Referring to FIG. 4, different from the previous embodiment, the non-volatile memory unit cell 400 further includes control gates CG3 and CG4 coupled to the floating polysilicon gates fg1/fg3 and floating polysilicon gates fg2/fg4 through different tunneling junctions, respectively. The control gates CG3 and CG4 can likewise be constructed by capacitors which, for example, are formed by appropriately coupling terminals of transistors. In this configuration, the tunneling junctions are formed in the control gates CG3 and CG4, not in the transistor pair M3 and M4. The transistor pair M3 and M4 are used in read path and serve as read transistors, and one of the S/D (source or drain) junctions of transistors M3 and M4 are connected to signal BLp. It helps to move the tunneling junctions away from read transistors, where tunneling junctions are susceptible to high voltage stress.

Figure 5A:
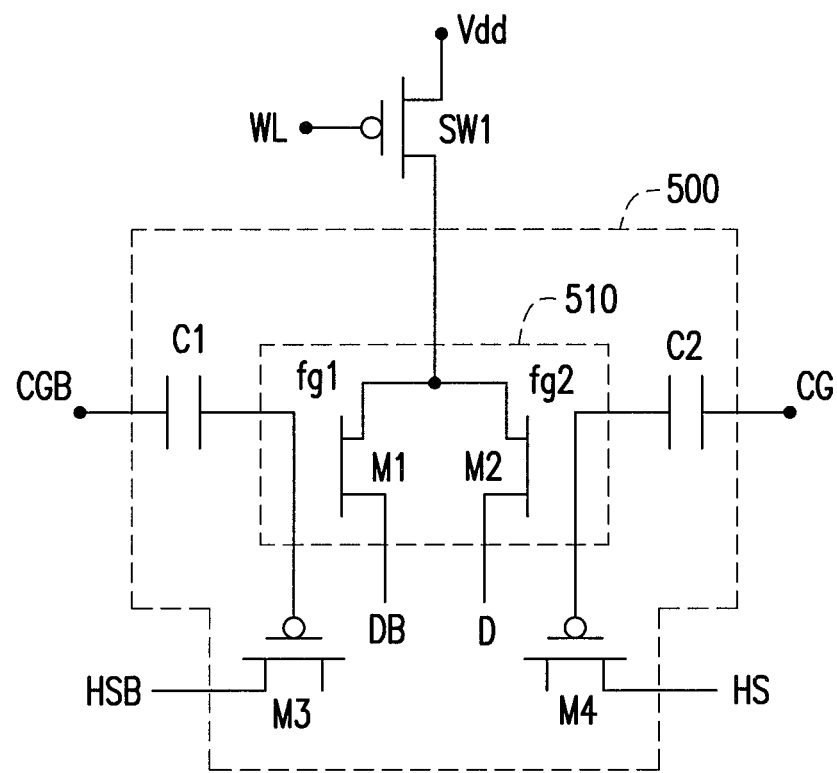
FIG. 5A illustrates an only-one-polysilicon layer non-volatile memory unit cell according to another embodiment of the present invention.

FIG. 5A illustrates a non-volatile memory unit cell 500 according to another embodiment of the present invention. Referring to FIG. 5A, the non-volatile memory unit cell 500 includes a transistor pair 510, transistors M3 and. M4, and coupling capacitors C1 and C2. The transistor pair 510 includes transistors M1 and M2 with one of S/D (source or drain) terminals connected. The transistors M1 and M2 have floating polysilicon gates fg1 and fg2, respectively, and the floating polysilicon gate fg1 and the floating polysilicon gate fg2 are electrically or physically isolated. One end of the coupling capacitor C1 is connected with the gate of the transistor M3 and capacitively coupled to the floating polysilicon gate fg1, and the other end of the coupling capacitor C1 receives a control voltage CGB. Similarly, one end of the coupling capacitor C2 is connected to the gate of the transistor M4 and capacitively coupled to the floating polysilicon gate fg2, and the other end of the coupling capacitor C2 receives a control voltage CG. In addition, the non-volatile memory unit cell 500 is connected with a transistor switch SW1 such that a voltage Vdd is supplied to the transistor pair 510 when the transistor switch SW1 is turned on based on a word line WL signal.

Figure 5B:
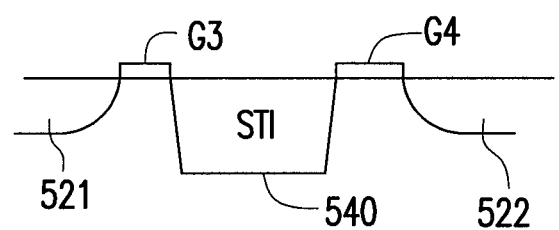
FIG. 5B illustrates a cross sectional view of transistors M3 and M4 during fabrication.

It is noted that the transistors M3 and M4 are not normal 4-terminals transistors with both source and drain junctions existing. FIG. 5B illustrates a cross section of the transistors M3 and M4 during fabrication. Referring to FIG. 5B, the transistor M3 only has the gate G3 and source (or drain) 521. In other words, the transistor M3 has no drain (or source). Likewise, the transistor M4 only has the gate G4 and source (or drain) 522. In other words, the transistor M4 has no drain (or source). A shallow trench isolation (STI) 540 is formed in the region where the drain (or source) should have been formed.

In the present embodiment, the coupling capacitors C1 and C2 can likewise be formed by capacitors (for example, P+/NW or N+/NW junction) or by appropriately coupling terminals of transistors, for example, P-type MOSFET. In addition, the coupling capacitors C1 and C2 may be constructed in a P-well of a deep N-well of an integrated circuit to reduce the voltage needed for writing and deleting data of the non-volatile memory unit cell 500. The transistors M1 and M2 of the transistor pair 510 are N-type MOSFETs, and the transistors M3 and M4 are P-type MOSFETs.

In the following, operation of the non-volatile memory unit cell 500 is described. In the present embodiment, during writing operation with respect to the floating polysilicon gate fg1 of transistor M1, deleting operation with respect to the floating polysilicon gate fg2 of transistor M2 needs to be performed synchronously. Namely, when the coupling capacitor C1 receives a high level (e.g. 8.5V on the condition of floating polysilicon gate oxide thickness is around 65 A) control voltage CGB to perform data writing, the coupling capacitor C2 receives a low level (e.g. 0V) control voltage CG to perform data deleting under the condition of NW of the transistors M3 and M4 receives a bias 8.5V (not shown in FIG. 5A). Specifically, the coupling capacitor C1 couples the received 8.5V voltage to the floating polysilicon gate fg1 causing a plurality of electrons to be injected to the floating polysilicon gate fg1 as a result of the F-N tunneling effect to achieve the data writing. Similarly, the coupling capacitor C2 couples the received 0V voltage to the floating polysilicon gate fg2 causing attracted electrons to be removed from the floating polysilicon gate fg2 as a result of the F-N tunneling effect to achieve the data deleting.

Optionally, the source (drain) of the transistor M3 receives a bias voltage HSB (e.g. 2V) and NW of the transistor M3 receives a bias 8.5V (not shown in FIG. 5A) with the 8.5V coupled to CGB. In this way, the bias setting will cause the electrons to be injected to the floating polysilicon gate fg1 as a result of a band-to-band tunneling hot electron effect to accelerate the writing operation. On the other hand, the source (drain) of the transistor M4 can receive a bias voltage HS (e.g. 8.5V), or receive a low level (e.g. 2V) bias voltage HS under the condition of the 0V applied to CG and the NW of the transistor M4 biased to 8.5V. This 2V bias voltage HS facilitates the transistor M4 injecting holes (removing electrons) to the floating polysilicon gate fg2 in a substrate hole injection manner to accelerate the data deleting operation. This 8.5V bias voltage HS facilitates the transistor M4 to pull the stored electrons from the floating polysilicon gate fg2 of the transistor M4. A deleting operation can be done in this manner.

In addition, the source (or drain) of the transistor pair 510 can receive a low level (e.g. 0V) bias voltage DB or maintain floating to assist the transistor M1 with data writing. The source (or drain) of the transistor M2 can likewise receive a low level (e.g. 0V) bias voltage D or maintain floating, or receive a high level (e.g. 6V) bias voltage D causing the transistor M2 to inject holes (removing electrons) to the floating polysilicon gate fg2 as a result of the band-to-band tunneling hot hole injection effect to accelerate the data deleting operation.

It is noted that when the coupling capacitors C1 and C2 are constructed in the P-well of the deep N-well of the integrated circuit, the control voltages CGB and CG can shift the voltage level. In the foregoing embodiments that the control voltages CGB and CG and the bias voltages HSB and HS are in the range of 0-8.5V, the control voltages CGB and CG and the bias voltages HSB and HS can be shifted to be in the range of −4.25-4.25V. In other words, the amplitude of the voltage necessary for writing and deleting operations with respect to the non-volatile memory unit cell 500 is effectively reduced due that the negative bias can be applied to the P-well of the deep N-well of the integrated circuit without direct shorting of P-well and P-substrate.

To perform reading operation with respect to the non-volatile memory unit cell 500, the transistor switch SW1 simply needs to be turned on allowing the voltage Vdd to be provided to the transistors M1 and M2, the transistors M1 and M2 conduct currents at its terminals that receive the bias voltages DB and D, respectively, and a comparison operation is performed, such that the data stored in the non-volatile memory unit cell 500 can be accessed and read out successfully. At the same time, the bias voltages HSB, HS, the control voltages CGB and CG can be set at logic high level (e.g. 1.8V) that is needed for common integrated circuits.

It is noted that, because the transistors M1 and M2 of the present embodiment are N-type MOSFETs, the N-type MOSFETs are believed to have twice driving current than P-type MOSFET and the correct data can be more quickly detected during reading operation.

The retention and reliability are also greatly improved in memory unit cell 600 due that the sensing margin is relative to the current difference between the off current of transistor M1 and on current of transistor M2 (based on the case of floating polysilicon gate fg1 in data writing mode and floating polysilicon gate fg2 in data deleting mode). If some electrons originally stored at floating polysilicon gate fg1 are leaking away from the floating polysilicon gate fg1 progressively, the memory unit cell still can work well thanks for the sensing margin is much larger than the external threshold value Iref generation scheme. Threshold value Iref variation is not a problem anymore. In prior art, threshold value Iref setting in between ON current and OFF current will eliminate the sensing margin, less than that in the above scheme (the difference between ON and OFF state).

Figure 6A:
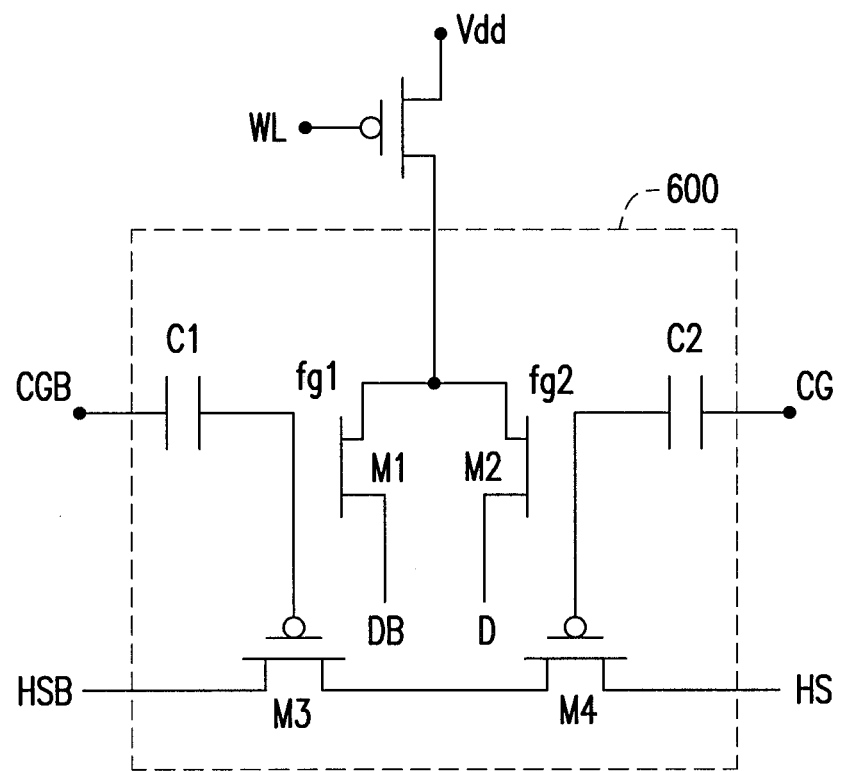
FIG. 6A illustrates an only-one-polysilicon layer non-volatile memory unit cell according to another embodiment of the present invention.
Figure 6B:
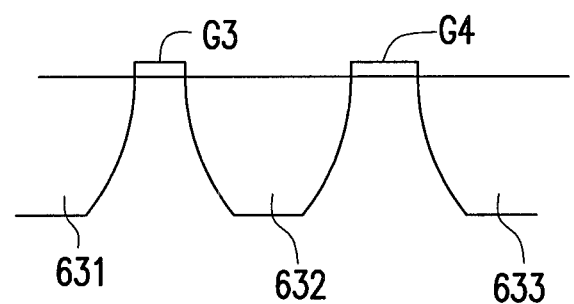
FIG. 6B illustrates a cross sectional view of transistors M3 and M4 during fabrication.

FIG. 6A illustrates a non-volatile memory unit cell 600 according to another embodiment of the present invention. Referring to FIG. 6A, different from the non-volatile memory unit cell 500 of the previous embodiment, the transistors M3 and M4 of the non-volatile memory unit cell 600 are transistors with both drain and source. FIG. 6B illustrates a cross section of the transistors M3 and M4 during fabrication. The transistor M3 has a gate G3, source (or drain) and a drain (or source) 631, 632. The transistor M4 has a gate G4, a source (or drain) and a drain (or source) 633, 632. The transistors M3 and M4 share the drain (or source) 632. The gate G3 of transistor M3 connected to a capacitor C1 and coupled to a control voltage CGB, and the gate of transistor M4 connected to a capacitor C2 and coupled to a control voltage CG.

In addition, during data writing operation for the transistor M1 and data deleting operation for the transistor M2 of the non-volatile memory unit cell 600, the transistor M3 receives a bias voltage HSB of, for example, 3.3V, and the transistor M4 receives a bias voltage HS of for example, 8.5V. As such, electrons are removed from the floating polysilicon gate fg2 by the transistor M4 through the high field F-N tunneling effect, and electrons are injected to the floating polysilicon gate fg1 by the transistor M3 as a result of the channel hot electron effect, thereby enhancing the efficiency of data writing and deleting.

Figure 7:
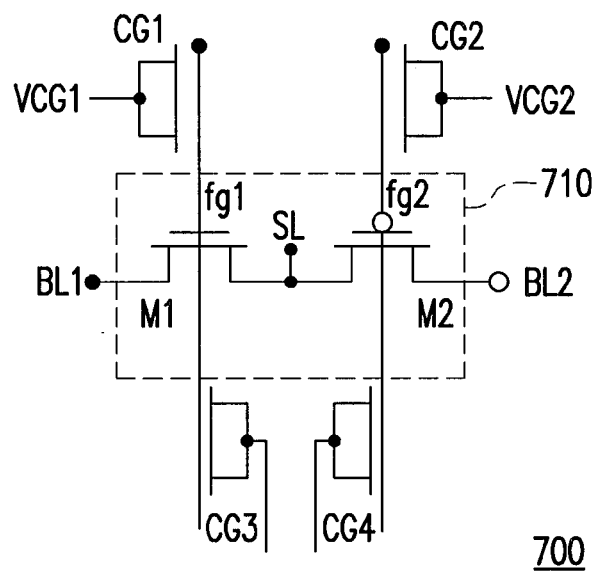
FIG. 7 illustrates an only-one-polysilicon layer non-volatile memory unit cell according to still another embodiment of the present invention.

FIG. 7 illustrates a non-volatile memory unit cell 700 according to still another embodiment of the present invention. Referring to FIG. 7, the non-volatile memory unit cell 700 includes a transistor pair 710 and control gates CG1, CG2, CG3 and CG4. The transistor pair 710 includes transistors M1 and M2 that are connected in parallel and of opposite types. The transistors M1 and M2 have floating polysilicon gates fg1 and fg2, respectively and the floating polysilicon gate fg1 and the floating polysilicon gate fg2 are electrically or physically isolated. In the present embodiment, the transistor M1 is an N-type MOSFET and the transistor M2 is a P-type MOSFET, and the transistors M1 and M2 connected to signal SL.

It is noted that, similar to the foregoing embodiments, all of the control gates CG1, CG2, CG3 and CG4 can be implemented by capacitors and the capacitors can be constructed by transistors with terminals being appropriately coupled to form the capacitors.

To perform writing and deleting operation for the non-volatile memory unit cell 700, two operating modes can be used. In one mode, writing or deleting operation is performed with respect to the two transistors of the transistor pair 710 at the same time (i.e. the same writing or deleting operation is performed with respect to the transistors M1 and M2 at the same time). In the other mode, while writing operation is performed with respect to one of the two transistors of the transistor pair 710. Data deleting operation is synchronously performed with respect to the other transistor of the transistor pair 710.

Figure 8:
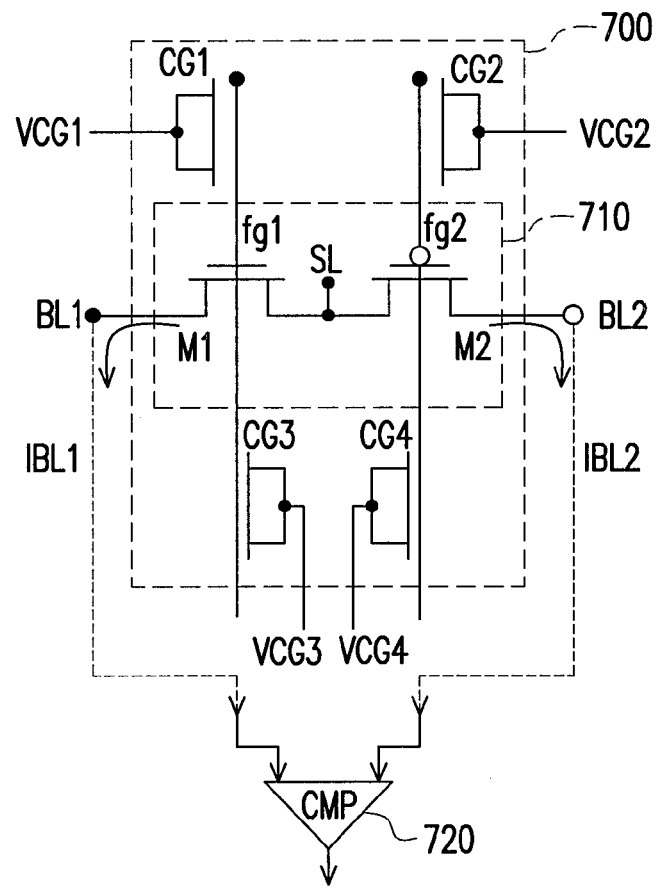
FIG. 8 illustrates a first operating mode of the only-one-polysilicon layer non-volatile memory unit cell of FIG. 7.

The first mode is first described below with reference to FIG. 8 which illustrates the first operating mode of the non-volatile memory unit cell 700. When writing operation is performed with respect to both transistors M1 and M2 at the same time, the control gates CG1, CG2, CG3 and CG4 can receive the high level control voltages VCG1-VCG4 at the same time. At this time, the floating polysilicon gates fg1 and fg2 are injected with a plurality of electrons to store data. At the same time, because the transistor M1 is N-type MOSFET and the transistor M2 is P-type MOSFET, the channel of the transistor M1 is turned off while the channel of the transistor M2 is turned on. In other words, when it is desired to read the data stored in the non-volatile memory unit cell 700, the data stored in the non-volatile memory unit cell 700 can be detected simply by comparing the currents IBL1 and IBL2 flowing out of the transistor M1 and the transistor M2 using a comparator 720 (at the above case, the current provided by the transistor M1 is less than the current provided by the transistor M2).

When deleting operation is performed with respect to both transistors M1 and M2 at the same time, the channel of the transistor M1 is turned on while the channel of the transistor M2 is turned off. At this time, the current IBL1 provided by the transistor M1 is larger than the current IBL2 provided by the transistor M2. Therefore, the status of the data stored in the non-volatile memory unit cell 700 can be determined based on the result of the comparing using the comparator 720.

The memory cell's reliability is also greatly improved by whole sensing margin of ON and OFF state which one cell is at ON-state and the other cell is at OFF-state while the memory window is defined as the current difference between the ON and OFF current.

Figure 9:
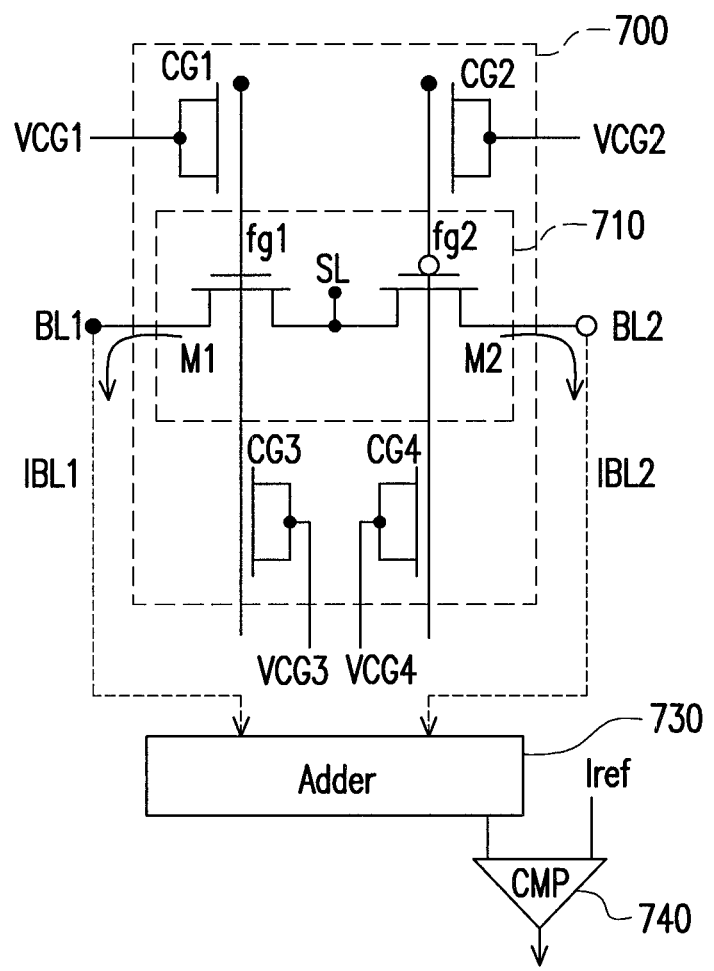
FIG. 9 illustrates a second operating mode of the only-one-polysilicon layer non-volatile memory unit cell of FIG. 7.

The second mode is described below with reference to FIG. 9 which illustrates the second operating mode of the non-volatile memory unit cell 700. When writing operation is performed with respect to the transistor M1 while data deleting operation is performed with respect to the transistor M2 at the same time, the control gates CG1, CG3 and CG4 can receive the high level control voltages VCG1, VCG3 and VCG4, respectively, while the control gates CG2 receive the low level control voltages VCG2 at the same time. At this time, the floating polysilicon gate fg1 is injected with a plurality of electrons to store data, while the electrons on the floating polysilicon gate fg2 are removed therefrom to delete data. At the same time, because the transistor M1 is N-type MOSFET and the transistor M2 is P-type MOSFET, both channels of the transistors M1 and M2 are turned off. In other words, when it is desired to read the data stored in the non-volatile memory unit cell 700, the data stored in the non-volatile memory unit cell 700 can be detected simply by adding up the currents flowing out of the transistor M1 and the transistor M2 to obtain a sum of the currents using an adder 730 and subsequently comparing the sum of the currents against a reference current Iref (the sum of the currents is much smaller than the reference current).

On the other hand, when data deleting operation is performed with respect to the transistor M1 while data writing operation is performed with respect to the transistor M2 at the same time, both channels of the transistors M1 and M2 are turned on. The sum of the currents is much larger than the reference current Iref and the status of the data stored in the non-volatile memory unit cell 700 can likewise be detected by comparing the sum of the currents against the reference current Iref using the comparator 720.

In summary, in embodiments of the present invention, data writing and deleting operations are achieved by providing multiple paths in the non-volatile memory unit cell and utilizing multiple effects to realize injection or removal of electrons or holes with respect to the floating polysilicon gates of the non-volatile memory cell. In addition, the operating voltage needed for the non-volatile memory unit cell can be effectively reduced and therefore the efficiency of data writing, deleting and reading can be effectively enhanced. Moreover, the present non-volatile memory unit cell can widen the memory window, reduce the possibility of data misjudgement caused by charge leakage at the floating polysilicon gates due to over-long time storage and hence reduce the failure rate.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An only-one-polysilicon layer non-volatile memory unit cell comprising:

a first P-type transistor having a gate and a first source/drain;

a second P-type transistor having a gate and a first source/drain;

a N-type transistor pair having a third transistor and a fourth transistor that are connected, the third transistor and the fourth transistor having a first floating polysilicon gate and a second floating polysilicon gate to serve as charge storage mediums, respectively, wherein the first floating polysilicon gate and the second floating polysilicon gate are electrically or physically isolated;

a first coupling capacitor, one end of the first coupling capacitor being connected to the gate of the first transistor and coupled to the first floating polysilicon gate, the other end of the first coupling capacitor receiving a first control voltage; and a second coupling capacitor, one end of the second coupling capacitor being connected to the gate of the second transistor and coupled to the second floating polysilicon gate, the other end of the second coupling capacitor receiving a second control voltage, wherein the N-type transistor pair is connected to a switch transistor, when the switch transistor is turned on according to a word line signal, data stored in the only-one-polysilicon layer non-volatile memory unit cell are read out.

2. The only-one-polysilicon layer non-volatile memory unit cell according to claim 1, wherein the first transistor further has a second source/drain, the second transistor also has a second source/drain and the second source/drain of the first transistor is coupled to the second source/drain of the second transistor.

3. The only-one-polysilicon layer non-volatile memory unit cell according to claim 1, wherein the salicide protection layer are added on top of the floating polysilicon gate layers for charge retention improvement.

4. The only-one-polysilicon layer non-volatile memory unit cell according to claim 3, wherein the third and fourth transistors are N-type native transistors or receiving additional lightly doped drain (LDD) implantation to reduce the threshold voltages.

5. The only-one-polysilicon layer non-volatile memory unit cell according to claim 1, wherein the first and second coupling capacitors are constructed in a P-well of a deep N-well.

* * * * *